United States Patent
Baier

(10) Patent No.: US 7,229,928 B2
(45) Date of Patent: Jun. 12, 2007

(54) METHOD FOR PROCESSING A LAYERED STACK IN THE PRODUCTION OF A SEMICONDUCTOR DEVICE

(75) Inventor: Ulrich Baier, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/216,524

(22) Filed: Aug. 31, 2005

(65) Prior Publication Data

US 2007/0049052 A1    Mar. 1, 2007

(51) Int. Cl.
*H01L 21/302* (2006.01)
*H01L 21/461* (2006.01)

(52) U.S. Cl. .................. 438/705; 438/725; 257/E21.25

(58) Field of Classification Search ................ 438/705, 438/725
See application file for complete search history.

(56) References Cited

U.S. PATENT DOCUMENTS

| | | | |
|---|---|---|---|
| 6,197,687 B1 * | 3/2001 | Buynoski | 438/671 |
| 6,762,130 B2 * | 7/2004 | Laaksonen et al. | 438/706 |
| 6,914,293 B2 * | 7/2005 | Yoshino | 257/324 |

* cited by examiner

*Primary Examiner*—W. David Coleman
(74) *Attorney, Agent, or Firm*—Slater & Matsil, L.L.P.

(57) ABSTRACT

A resist layer is deposited a resist layer on a first layer of a layered stack. The stack also includes a second layer below the first layer. The resist layer is processed with a lithographic method to achieve a first structured resist layer. At least a part of the first structured resist layer is trimmed to achieve a second structured resist layer having at least in parts a structure with a critical dimension smaller than obtainable by processing the resist with a lithographic method. The first layer is selectively removed from the second layer in the areas not covered by the second structured resist layer. The second layer is modified by implantation to become a layer with defined selectivity to the non-modified material. The remains of the first layer are removed. The non-modified structures of the second layer are removed to create a hardmask layer by the remaining layer. The layered stack is further structured with the hardmask layer.

22 Claims, 10 Drawing Sheets

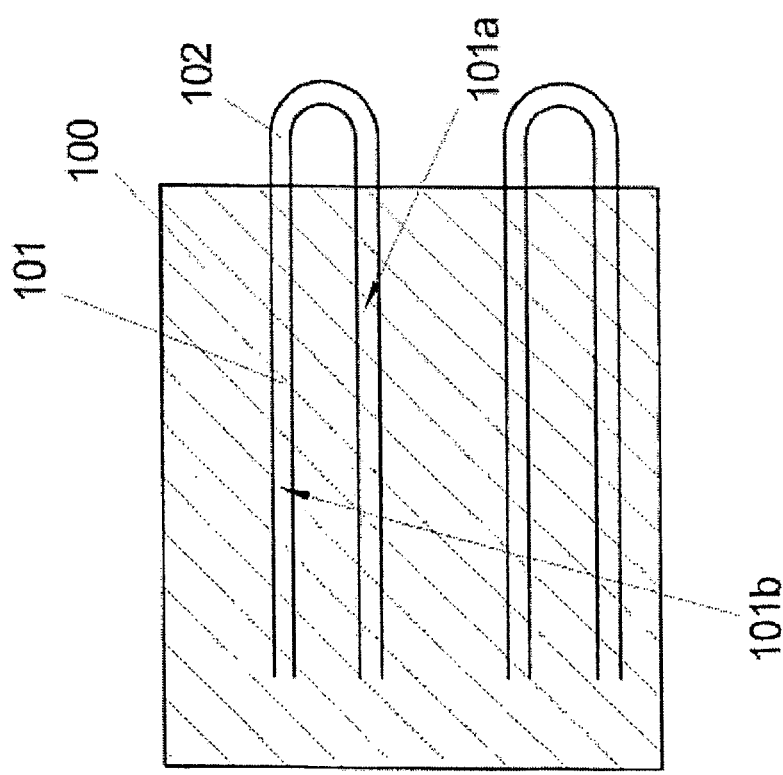

Fig. 23 a) Depositing a resist layer on a first layer of a layered stack, the stack further comprising a second layer below the first layer

b) processing the resist layer with a lithographic method to achieve a first structured resist layer

c) Trimming at least a part of the first structured resist layer to achieve a second structured resist layer having at least in parts a structure with a critical dimension smaller than obtainable in step b)

d) Removing the first layer selectively from the second layer in the areas not covered by the second structured resist layer,

e) modifying the second layer by implantation to become a layer with defined selectivity to the non-modified material

f) removing the remains of the first layer

g) removing the non-modified structures of the second layer to create a hardmask layer by the remaining layer

h) further structuring the layered stack with the hardmask layer.

METHOD FOR PROCESSING A LAYERED STACK IN THE PRODUCTION OF A SEMICONDUCTOR DEVICE

TECHNICAL FIELD

This invention relates generally to semiconductors and processes and, in a particular embodiment, to processing of a layered stack in the production of semiconductor devices, such as DRAM chips or processors.

BACKGROUND

In the lithographic processes usually applied in the production of such devices, it is the general goal to achieve ever smaller structures. That is, the critical dimensions (CD) have to become smaller to allow a higher integration of the semiconductor devices.

The problem is that optical and other physical or chemical limitations of a current process generation do not allow the production of structure beyond a certain threshold. Currently deep ultra violet (DUV) light lithography with wavelengths of 248 nm or 198 nm is under development. The limit for CD using this technology seems to be a critical dimension of about 60 nm.

SUMMARY OF THE INVENTION

In one aspect, the present invention devises a process with which the limit of the critical dimension is lowered.

In the processing or production of semiconductor devices, in particular DRAM chips, the feature size decreases continuously.

With a method according to embodiments of the invention, it is possible to manufacture structures for semiconductors that are smaller than the ones obtainable by known DUV-Lithography processes.

In one embodiment, a resist layer is deposited a resist layer on a first layer of a layered stack. The stack also includes a second layer below the first layer. The resist layer is processed with a lithographic method to achieve a first structured resist layer. At least a part of the first structured resist layer is trimmed to achieve a second structured resist layer having at least in parts a structure with a critical dimension smaller than obtainable by processing the resist with a lithographic method. The first layer is selectively removed from the second layer in the areas not covered by the second structured resist layer. The second layer is modified by implantation to become a layer with defined selectivity to the non-modified material. The remains of the first layer are removed. The non-modified structures of the second layer are removed to create a hardmask layer by the remaining layer. The layered stack is further structured with the hardmask layer.

The layered stack can have additional layers apart from the first and second layers.

The trimming of at least a part of the first structured resist layer produces a smaller structure in the resist (i.e., in the second structured resist layer) that can then be transferred into the hardmask layer, which is generated from the second layer of the layered stack. Therefore, the hardmask layer contains the inverse structure of the second structured resist layer. With this small structure in the hardmask layer further processing steps are possible.

BRIEF DESCRIPTION OF THE DRAWINGS

Other features and advantages of the invention become apparent upon reading of the detailed description of the invention, and the appended claims provided below, and upon reference to the drawings, in which:

FIGS. 22A, 22B schematically show a top view of linear structures manufactured according to the third embodiment of the method; and FIG. 23 provides flowchart of one embodiment method according to the invention.

DETAILED DESCRIPTION OF ILLUSTRATIVE EMBODIMENTS

In a first embodiment, the principle to obtain a structured hardmask for structuring a layered stack is described. In further embodiments, two specific applications are described.

For the sake of simplicity the process steps are shown only schematically for a single and very simple structure. Naturally many different structures and more complex structures are present in a semiconductor device, such as a memory, such as a DRAM, an SRAM, or a non-volatile memory (e.g., flash, EPROM, EEPROM, MRAM, FRAM), or a processor, such as a microprocessor, a digital signal processor or other processors or controllers.

Figure 1:
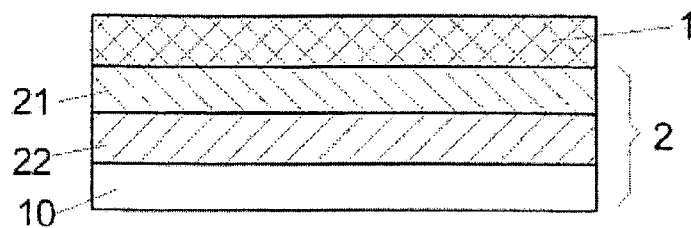
FIG. 1 schematically shows the first process step of a first embodiment of the method according to the present invention, i.e. depositing a resist layer.

In a first process step, depicted in FIG. 1 a resist layer 1 is deposited (e.g., by spinning) on a layered stack 2. The resist layer 1 can be made of any resist that is suitable for the wavelength of the employed lithography method. In present embodiment, a wavelength of 193 nm (DUV) is used, so a known DUV-resist is chosen. In principle, any wavelength for which a trimmable resist exists can be used. The methods for depositing a resist layer 1 on the layered stack 2 are known in the art.

The layered stack 2 can be a typical stack used in the production of a semiconductor device, such as a memory (e.g., DRAM) or a processor. Examples for those stacks will be detailed later. The layered stack 2 is here located on a substrate 10 (e.g., silicon wafer). In general the layered stack 2 can comprise more layers and other kinds of substrates (e.g., SOI or SiGe).

At least one layer in the layered stack 2 (or a part of it) can finally function as a hardmask, which can be used to structure other parts of the layered stack.

In the first embodiment depicted in FIG. 1, the layered stack 2 comprises a first layer 21 and a second layer 22.

Figure 2:
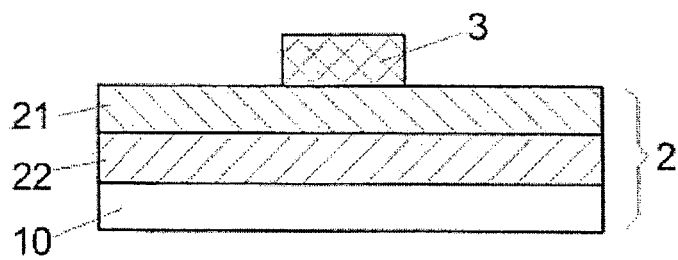
FIG. 2 schematically shows the second process step of the first embodiment of the method according to the present invention, e.g., obtaining a first structured resist layer.

In FIG. 2 a second process step is depicted, i.e. a processing of the resist layer 1 with a lithographic method to achieve a first structured resist layer 3. The method for producing the first structured resist layer 3 can be a resist developing process known in the art. The critical dimension of the first structured resist layer 3 is limited by the lithography method employed.

Optionally the layered stack 2 can additionally be structured by a plasma etch step using the first structured resist layer 3 as a mask. This is the conventional structuring step in semiconductor manufacturing.

Figure 3:
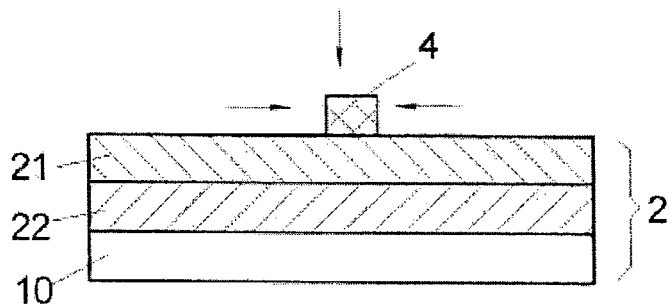
FIG. 3 schematically shows the third process step of the first embodiment of the method according to the present invention, e.g., obtaining a second structured resist layer by resist trimming.

In a third process step (FIG. 3), at least a part of the first structured resist layer 3 is shrunk by a resist trimming step indicated by the arrows. The resist trimming is achieved here by a plasma etching step, using an $O_2$ containing plasma. Alternatively, a $Cl_2$ containing plasma or any other suitable plasma for resist trimming can be used. After the resist trimming step the resist layer becomes the second structured resist layer 4.

The following steps form the basis to produce a structure in the hardmask that is smaller than the structure obtainable in the second process step.

The part of the layered stack 2 that is not covered by the second structured resist layer 4, is treated such, that the wet- or plasma etch selectivity is changed relative to the untreated part of the layered stack 2. For example, the etch rate of the treated part of the layered stack 2 becomes lower than the etch rate of the untreated part of the layered stack 2. The treated part of layered stack 2 becomes a hardmask layer in the following process.

The treatment in the fourth process step (FIG. 4) can, for example, be achieved as described now. The layered stack 2 comprises the two layers 21, 22. In one example, layer 22 is an amorphous silicon (a-Si) layer and layer 21 is any implant blocking material, which shows the appropriate etch selectivities needed in later processing. For example, layer 21 can be silicon oxide (e.g., $SiO_2$).

Figure 4:
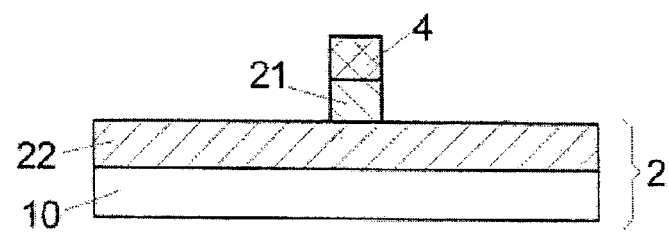
FIG. 4 schematically shows the fourth process step of the first embodiment of the method according to the present invention, e.g., removing parts of a first layer of a layered stack.

In the fourth process step the uncovered part of layer 21 is removed selectively from layer 22. e.g. by wet etching or plasma etching (FIG. 4).

Figure 5:
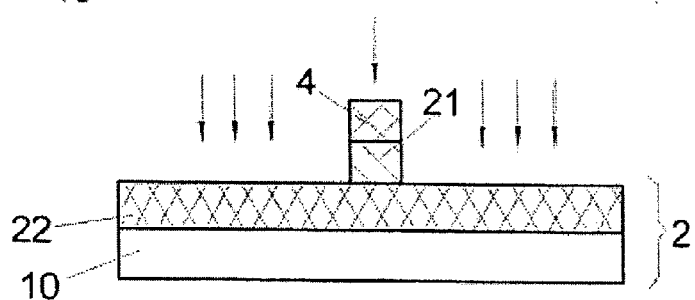
FIG. 5 schematically shows the fifth process step of the first embodiment of the method according to the present invention, e.g., obtaining a hardmask by modifying a second layer in a layered stack.

In the fifth process step (FIG. 5), the second layer 22 is implanted with which changes the etchability of the layer. For example, the a-Si layer 22 can be implanted with $BF_2$. Other examples are also possible. The complete second layer 22 is implanted. Where the first layer 21 is still present, the $BF_2$ implant is stopped in the first layer 21. Where there is no first layer 21 left, the second layer 22 is implanted and becomes a hard mask layer. The wet etch rate of the implanted a-Si of layer is now modified.

In a sixth step, the remaining resist 4 and the remaining layer 21 are removed, for example, by standard ash and etch processes. Then the non-implanted part of layer 22 is removed by wet etch (e.g., ammonia etch) selectively to the implanted parts of layer 22, utilizing the etch rate differences created in step 5.

This way a negative image of the positive structure of the second structured resist layer 4 is created in the hardmask layer (i.e., the second layer 22). Since the second structured resist layer 4 is a shrinked version of the structure of the first structured resist layer 3, which was created lithographically, a shrinked negative image of the lithographically created structure of layer 3 is created.

Figure 6:
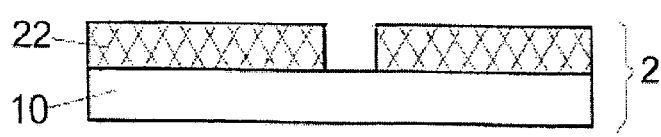
FIG. 6 schematically shows the result of the sixth process step of the first embodiment of the method according to the present invention.

FIG. 6 shows the layered stack 2 after the non implanted parts of layer 22 have been removed. The hard mask 22 can now be used to structure the remaining layered stack 2.

Using this process a hardmask layer for via and line structures with widths smaller than 30 nm can be produced. The process steps are also indicated in the flowchart in FIG. 23. Those process steps are also applicable to the other embodiments of the invention.

In effect the small positive structure in the second structured resist layer 4 has been inverted into a small negative structure in the hardmask layer 22.

A second embodiment of the invention is concerned with the manufacturing of a hardmask for a contact hole (via). This embodiment will be described with respect to FIGS. 7–13. Process details described here also apply to the first embodiment, and vice versa.

Figure 7:
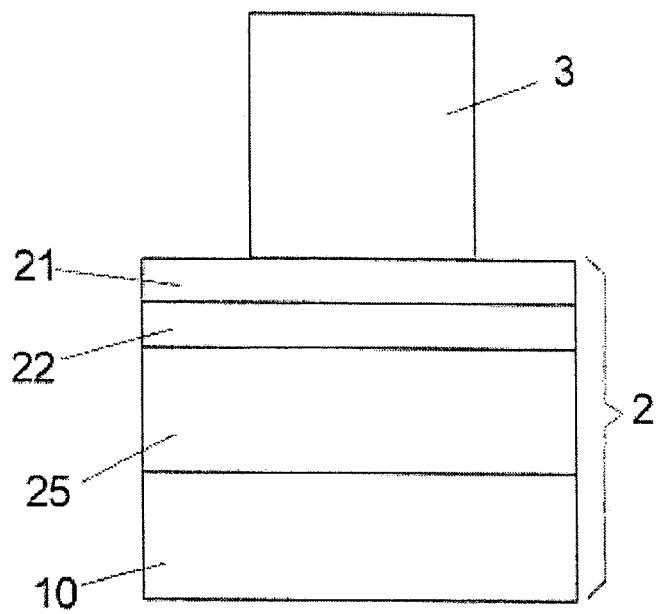
FIG. 7 schematically shows a first process step of a second embodiment of the method according to the present invention, e.g., obtaining a first structured resist layer on a stack of layers on a substrate.

In FIG. 7 the situation after a first process step is depicted, i.e., a first structured resist layer 3 is situated on a layered stack 2. The structures of the layer 3 are "plugs" of resist, located where vias are to be structured in the final product. The structures are preferably as small as possibly achievable by lithography. Unlike in the first embodiment, the layered stack 2 comprises four layers 21, 22, 25, 10, which will be described in the following.

In the preferred embodiment, the first layer 21 is a silicon oxide (e.g., SiO$_2$) layer that is thick enough to block a shallow BF$_2$ implantation. In one example, the first layer 21 has thickness between about 15 and about 150 nm. In principle, oxides other than SiO$_2$ can be used as long as they can be etched selectively to the layer underneath.

The second layer 22 underneath the first layer 21 is an amorphous silicon layer, in this example. This layer can have a thickness between about 15 and about 40 nm.

Below the second layer 22, a carbon layer 25 is positioned. This layer 25 will be structured later to become a carbon hardmask. If the carbon hardmask needs a top layer of SiON, this layer would be positioned over the carbon hardmask, i.e. here under the second layer 22.

At the bottom of the stack, a substrate 10 (e.g., silicon wafer or layer over a silicon wafer) is positioned into which the contact hole will be manufactured. For example, a via hole is often formed in a dielectric layer, e.g., interlayer dielectric or intermetal dielectric. In the following, a "substrate" does not necessarily mean silicon wafers but may also comprise an oxide/dielectric layer, e.g. in the backend of line/metallization module.

If an organic ARC layer is used in such an embodiment, the ARC layer is opened in the lithographic development (see FIG. 7). The ARC layer is then part of the first resist layer 3 and is trimmed to the structured resist layer 4.

In FIGS. 7 to 13 this stack is processed so that above mentioned specifications are not repeated for each figure. Details discussed above (or below) are not necessarily repeated.

Figure 8:
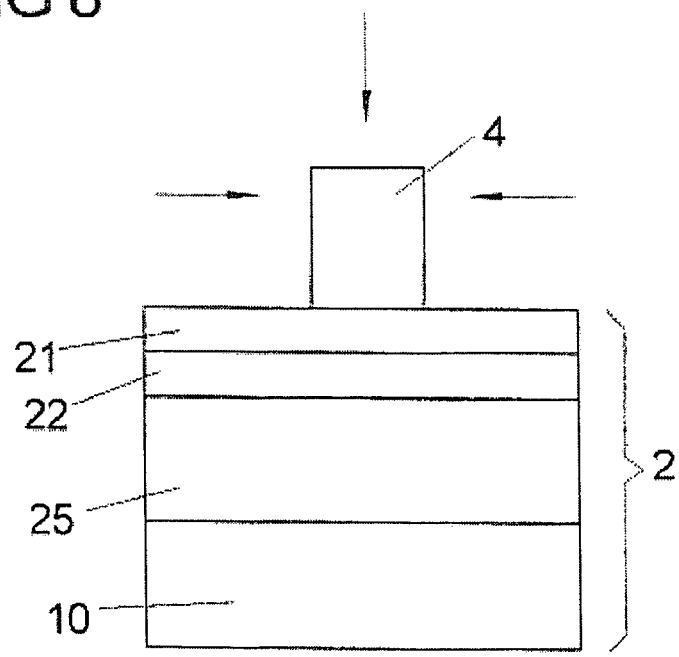
FIG. 8 schematically shows a second process step of the second embodiment of the method according to the present invention, e.g., obtaining a second structured resist layer.

FIG. 8 depicts the result of the second process step in which the first structured resist layer 3 is transformed into the second structured resist layer 4 by resist trimming. The trimming is performed by an O$_2$ or Cl$_2$ containing plasma etch. The etching has to be selectively performed to the oxide in the first layer 21.

Figure 9:
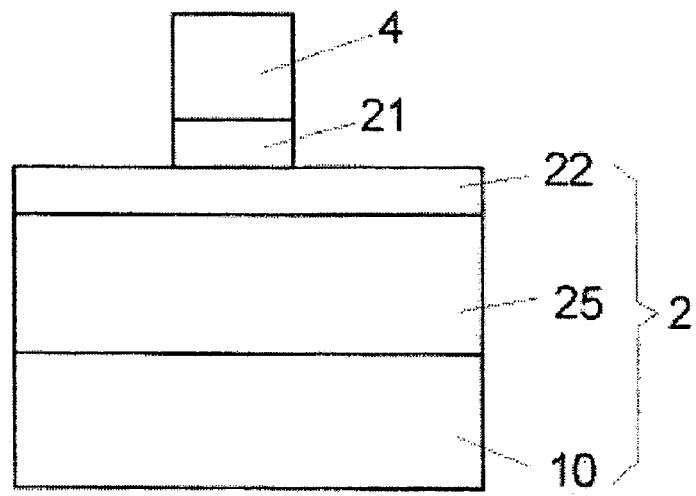
FIG. 9 schematically shows a third process step of the second embodiment of the method according to the present invention, e.g., removing an oxide layer under the resist.

FIG. 9 depicts the result of the third process step in which the oxide layer 21 is removed from the amorphous silicon layer 22 by a plasma etch process. The second structured resist layer 4 forms the mask for this process step. The resist budget (e.g., the thickness) can be rather low since the oxide layer is rather thin.

Figure 10:
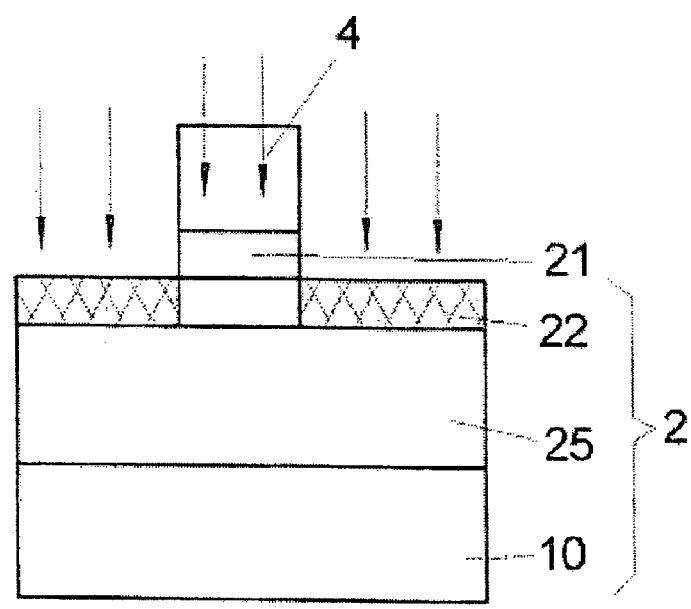
FIG. 10 schematically shows a fourth process step of the second embodiment of the method according to the present invention, e.g., BF2 implanting.

In FIG. 10, the result of the fourth process step is described. As indicated by the vertical arrows the a-Si layer 22 is implanted with BF$_2$. Since the implantation is rather shallow, the a-Si layer 22 should be rather thin to be completely implanted. The BF$_2$ implant is sufficient to modify the wet etch rate of the a-Si 22. The shallow implantation and the subsequent formation of a hardmask layer are indicated in FIG. 11 as the hatched area, as in analogue situation in the first embodiment.

Optionally the remains of the second structured resist layer 4 could be removed before the implantation.

Rather than performing a BF$_2$ implantation, an implantation could be alternatively achieved by thermal diffusion from layer 21 into layer 22. It is also possible to modify the second layer using materials, which could be cross-linked using UV-light (planar light).

Figure 11:
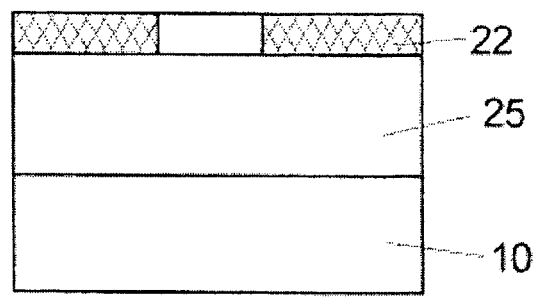
FIG. 11 schematically shows a fifth process step of the second embodiment of the method according to the present invention, e.g., resist stripping.

In FIG. 11 the result of the fifth process step is described. The second structured resist layer 4 has been stripped and the oxide layer 21 is removed by either a wet etch or a plasma etch. The etch process has to be selective to the amorphous silicon.

Figure 12:
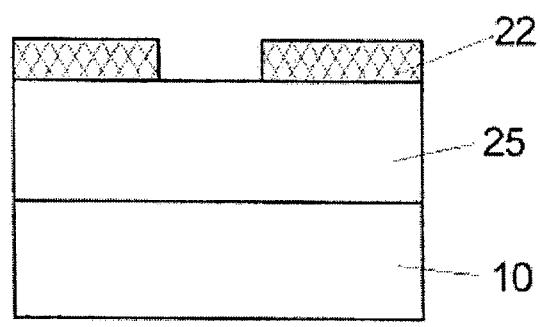
FIG. 12 schematically shows a sixth process step of the second embodiment of the method according to the present invention, e.g., removing undoped a-Silicon.

In FIG. 12 the result of the sixth process step is described. An ammonia wet etch, being selective to the layers underneath, removes the undoped amorphous silicon. The doped amorphous silicon remains.

After the sixth process step, an amorphous silicon hardmask layer is formed from the second layer 22 (as shown in FIG. 11). The structure in the amorphous silicon hardmask layer 22 is smaller than the resist structure in the first structured resist layer 3. The thickness of the amorphous silicon hardmask layer 22 (i.e., the second layer 22) can be rather small since the carbon hardmask 25 below the second layer 22 can be etched with a high selectivity. In effect the positive structure in the resist (plug) has been inverted into a negative structure (hole) in the hardmask layer.

Figure 13:
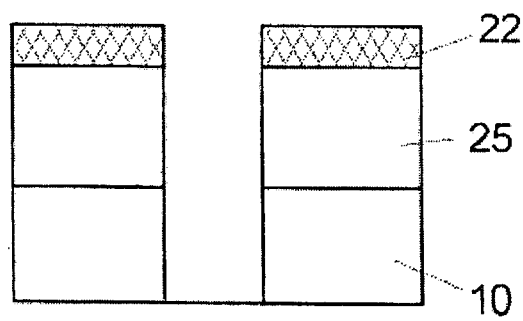
FIG. 13 schematically shows a seventh process step of the second embodiment of the method according to the present invention, e.g., opening of carbon hardmask.

In following process steps, an opening is formed in the carbon hardmask 25 and the substrate 10 are etched, e.g., using known principles. The result after these steps is depicted in FIG. 13.

A thin layer, especially a SiON layer, not depicted, could be deposited on the carbon hardmask to enhance the adherence of the amorphous silicon or for improving the selectivity. Consequently the amorphous silicon layer 22 would be a hard mask to the thin layer. The thin layer would then in turn function as hard mask for etching the carbon hardmask.

FIGS. 14 to 22 schematically describe a third embodiment of the process. Whereas the second embodiment was concerned with a contact hole, the third embodiment is concerned with the manufacturing of linear structures.

Figure 14:
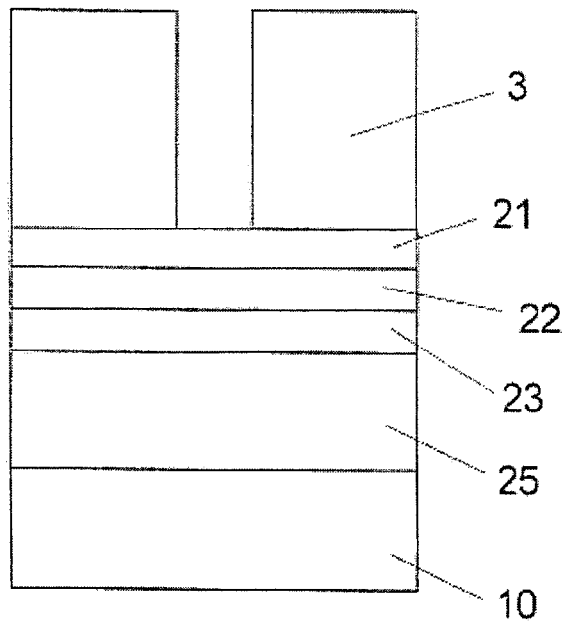
FIG. 14 schematically shows a first process step of a third embodiment of the method according to the present invention, e.g., structuring a first resist layer.
Figure 15:
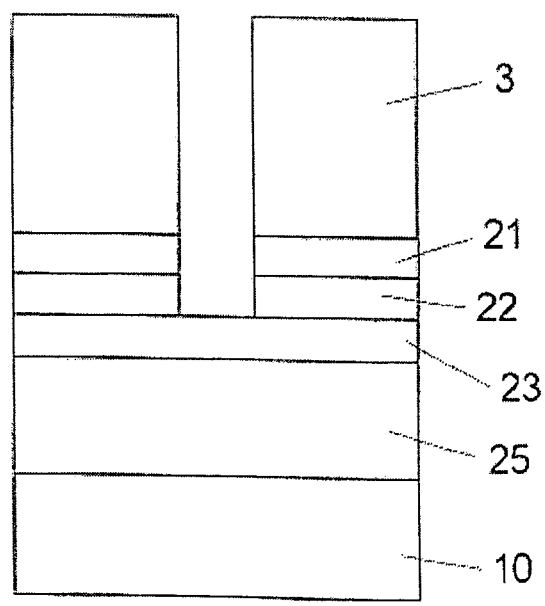
FIG. 15 schematically shows a second process step of the third embodiment of the method according to the present invention, e.g., structuring an nitride- and oxide layer.

In FIG. 14 the starting point of the third embodiment of the process is depicted.

A resist layer (not depicted; see e.g., layer 1 in FIG. 1) has been deposited on a layered stack, in this case a stack having at least layers 21, 22, 23, 25, 10.

The resist layer has been structured so that FIG. 14 depicts a first structured resist layer 3. The etching of the first resist layer 3 goes down to the first layer 21, which, in the preferred embodiment is an oxide layer, such as a layer 21 comprising essentially SiO$_2$. The structure formed in the first structured resist layer 3 is preferably as small as possibly achievable with the DUV lithography.

Figure 18:
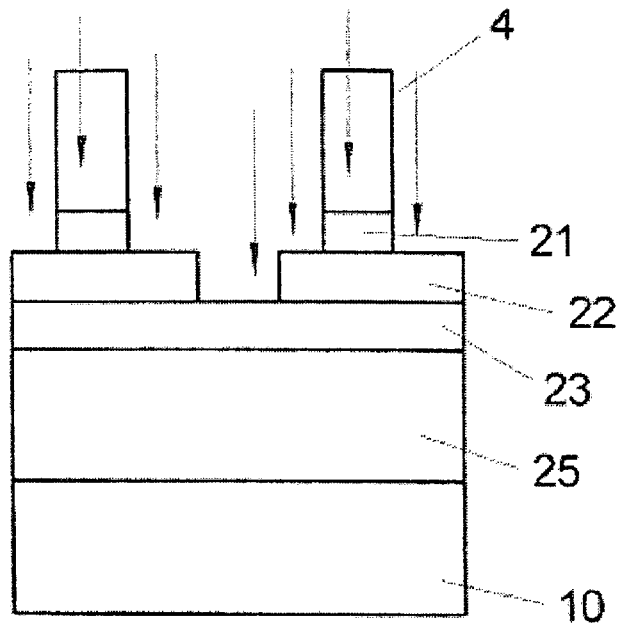
FIG. 18 schematically shows a fifth process step of the third embodiment of the method according to the present invention, e.g., BF2 implanting of a-Silicon layer.
Figure 19:
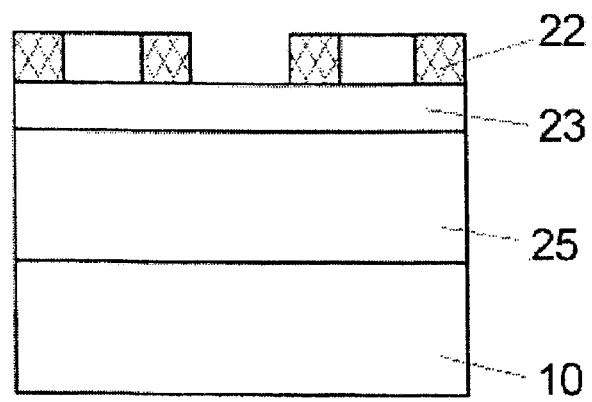
FIG. 19 schematically shows a sixth process step of the third embodiment of the method according to the present invention, e.g., stripping the second structured resist layer.

The oxide layer 21 should be thick enough to block a BF$_2$ implantation in a subsequent process step (see FIG. 18). Here, a thickness of the oxide layer 21 of about 20 to about 50 nm is chosen. In principle a different material can be chosen for the first layer, as long as it can be selectively etched against the second layer 22, e.g., amorphous silicon layer underneath. The amorphous silicon layer 22 preferably has a thickness of about 15 to about 40 nm.

So far the third embodiment of the process is similar to the second embodiment depicted in FIGS. 7 to 13. As before, details described earlier apply to the third embodiment (and details of the third embodiment can apply to the earlier embodiments).

The third embodiment comprises a nitride layer (e.g., Si$_3$N$_4$) or a SiON layer 23 with a thickness between about 15 to about 40 nm. This layer is required to stop an ammonia etch and is selectively etched with respect to the amorphous silicon layer 22.

The other layers in the third embodiment are similar to the second embodiment, e.g., a carbon hardmask 25 and a substrate 10. It is in the substrate 10 that the linear structures are to be manufactured.

In the second process step (FIG. 15) of the third embodiment, the oxide layer 21 and the amorphous silicon layer 22 are selectively etched by a plasma to the nitride layer 23. If an organic ARC layer is present, this layer would have to be removed before. Due to the thin oxide layer 21 and the thin amorphous silicon layer 22, the resist budget can be small.

Figure 16:
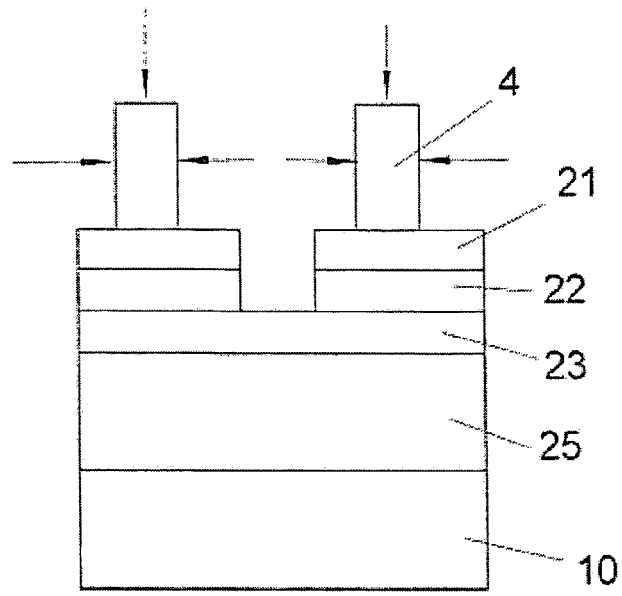
FIG. 16 schematically shows a third process step of the third embodiment of the method according to the present invention, e.g., trimming the first resist layer.
Figure 17:
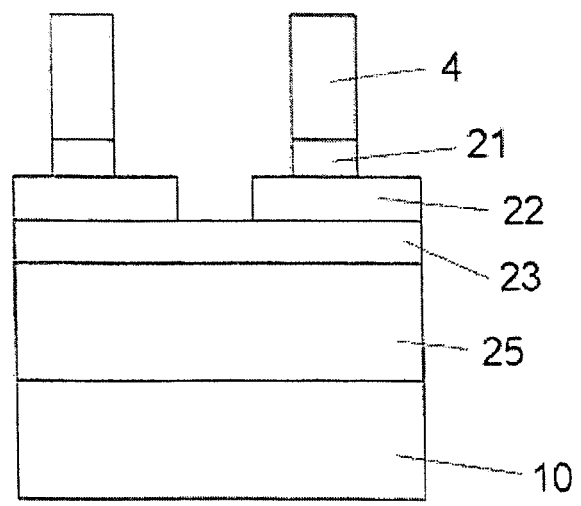
FIG. 17 schematically shows a fourth process step of the third embodiment of the method according to the present invention, e.g., selectively etching the oxide layer.

The third process step is depicted in FIG. 16. The first structured resist layer 3 is shown here after trimming, i.e., it has become the second structured resist layer 4. In one example, the resist trimming was effected by an $O_2$ containing plasma, being selective to the nitride layer 21, 22 and 23.

The fourth process step (FIG. 17) is concerned with the selective plasma etching of the oxide layer 21, whereas the etching is selective to the amorphous silicon layer 22 and the nitride layer 23.

As in the second embodiment, the fifth process step (FIG. 18) comprises a shallow $BF_2$ implantation to modify the wet etch rate of the amorphous silicon layer 22. Optionally, the second structured resist layer 4 can be removed before this step.

Figure 20:
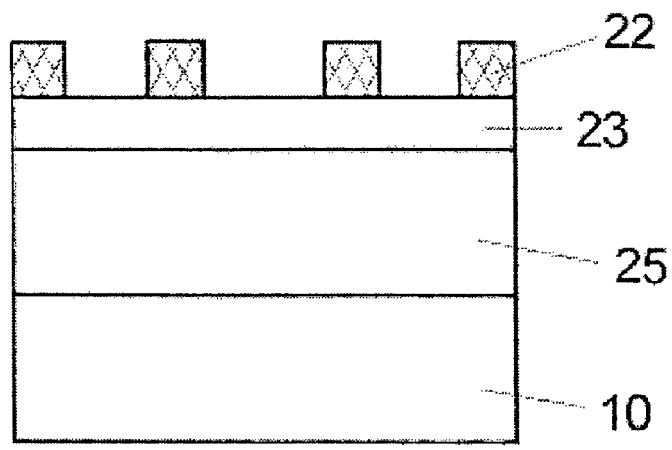
FIG. 20 schematically shows a seventh process step of the third embodiment of the method according to the present invention, e.g., structuring an nitride- and oxide layer.

The sixth process step (FIG. 19) results in two double line structures in the amorphous silicon layer 22. To achieve that the remaining resist layer 4 (if not removed in the fifth process step) and the oxide layer 21 are removed. Furthermore, the undoped amorphous silicon is etched away in the seventh process step with an ammonia wet etch to produce the two double line structures (FIG. 20).

Figure 21:
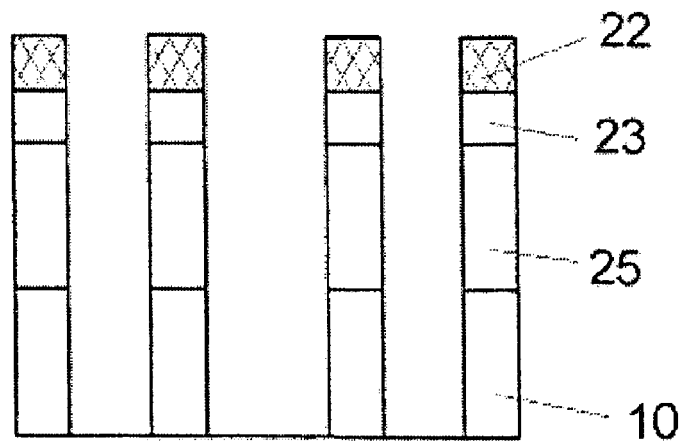
FIG. 21 schematically shows an eighth process step of the third embodiment of the method according to the present invention, e.g., opening hardmask.

In FIG. 21 the amorphous silicon hardmask formed from the amorphous silicon layer 22 and is used in the eighth process step to open the nitride layer 23 and both layers together are used to open the carbon hardmask layer 25. The line structures are created in an area where the resist layer was trimmed. This way linear structures with very narrow CDs can achieved. Here, a small, positive structure in the resist can be transformed into two small positive structures in the substrate 10.

As in the second embodiment, the steps for structuring the substrate 10 can be performed using techniques that are known in the art. FIG. 21 depicts the opened hardmask layer 25 and the structured substrate 10.

Top views on the line structures 101 are depicted in FIGS. 22A and 22B.

Employing the method according to the third embodiment, two line structures 101a and 101b are created, one at each side of an original line structure on the resist layer 4. At the end of the line structure in the resist layer 4 the two final line structures merge into one. This results in circular structures 102 at the end of the line structures 101 (FIG. 22A). In order to create separated final line structures 101a and 101b, the curved part 102 are etched away. This can be achieved by covering the lines 101 with a large area mask 100 and etching the area outside the mask 100. This removes those circular structures 102 (FIG. 22B).

The resulting line structures have a CD of 30 nm or even less.

Although the present invention and its advantages have been described in detail, it should be understood that various changes, substitutions and alterations can be made herein without departing from the spirit and scope of the invention as defined by the appended claims.

What is claimed is:

1. A method for structuring a layered stack in the production of a semiconductor device, the method comprising:
   depositing a resist layer on a first layer of the layered stack, the stack further comprising a second layer below the first layer;
   processing the resist layer with a lithographic method to achieve a first structured resist layer;
   trimming at least a part of the first structured resist layer to achieve a second structured resist layer, the second structured resist layer having at least in parts a critical dimension smaller than a critical dimension of the first structured resist layer;
   removing the first layer selectively from the second layer in the areas not covered by the second structured resist layer,
   modifying an exposed portion of the second layer by implantation in order to change the etchability of the modified portion of the second layer relative to unmodified portions of the second layer;
   removing remaining portions of the first layer;
   removing the unmodified portions of the second layer utilizing the etch rate difference between the modified and the unmodified portions of the second layer, thereby creating a hardmask layer from modified portions of the second layer; and
   further structuring at least one lower layer of the layered stack, the further structuring using the hardmask layer.

2. The method according to claim 1, wherein the first layer of the layered stack comprises an implant blocking material.

3. The method according to claim 1, wherein the first layer comprises an oxide layer.

4. The method according to claim 1, wherein the first layer comprises a material selected from the group consisting of silicon oxide, TEOS, BSG, BPSG, nitride, SiN, and SiON.

5. The method according to claim 1, wherein the first layer has thickness between about 20 to about 50 nm.

6. The method according to claim 1, wherein the second layer of the layered stack comprises amorphous silicon.

7. The method according to claim 1, wherein the second layer has a thickness between about 15 and about 40 nm.

8. The method according to claim 1, wherein modifying an exposed portion of the second layer by implantation comprises implanting $BF_2$.

9. The method according to claim 1, wherein the trimming is performed with a plasma etch process.

10. The method according to claim 1, wherein the layered stack comprises a carbon layer to be used as a hardmask in the further structuring of the layered stack.

11. The method according to claim 1, wherein the first layer comprises silicon dioxide.

12. The method according to claim 1, wherein the second structured resist layer is removed before the removal of the first layer in a separate process step.

13. The method according to claim 1, wherein the further structuring comprises forming a via hole.

14. The method according to claim 1, wherein the further structuring comprises forming a linear structure.

15. The method according to claim 9, wherein the plasma etch process comprises an anisotropic plasma etch process.

16. The method according to claim 9, wherein the plasma etch process comprises an $O_2$ containing plasma etching process.

17. The method according to claim 9, wherein the plasma etch process comprises a $Cl_2$ containing plasma etching.

18. The method according to claim 10, wherein the carbon layer has a thickness between about 50 nm and about 1000 nm.

19. The method according to claim 10, wherein a nitride layer is deposited above the carbon hardmask layer.

20. The method according to claim 13, wherein forming the via hole comprises etching an intermetal dielectric.

21. A method for structuring a layered stack in the production of a semiconductor device, the method comprising:
   depositing a resist layer on a first layer of the layered stack, the stack further comprising a second layer below the first layer, wherein the layered stack comprises a carbon layer to be used as a hardmask in the further structuring of the layered stack;

processing the resist layer with a lithographic method to achieve a first structured resist layer;

trimming at least a part of the first structured resist layer to achieve a second structured resist layer, the second structured resist layer having at least in parts a critical dimension smaller than a critical dimension of the first structured resist layer;

removing the first layer selectively from the second layer in the areas not covered by the second structured resist layer, modifying an exposed portion of the second layer by implantation;

removing remaining portions of the first layer;

removing portions of the second layer that have not been modified by the implantation thereby creating a hardmask layer from modified portions of the second layer; and further structuring at least one lower layer of the layered stack, the further structuring using the hardmask layer.

22. A method for structuring a layered stack in the production of a semiconductor device, the method comprising:

depositing a resist layer on a first layer of the layered stack, the stack further comprising a second layer below the first layer;

processing the resist layer with a lithographic method to achieve a first structured resist layer;

trimming at least a part of the first structured resist layer to achieve a second structured resist layer, the second structured resist layer having at least in parts a critical dimension smaller than a critical dimension of the first structured resist layer;

removing the first layer selectively from the second layer in the areas not covered by the second structured resist layer, modifying an exposed portion of the second layer by implantation;

removing remaining portions of the first layer;

removing portions of the second layer that have not been modified by the implantation thereby creating a hardmask layer from modified portions of the second layer; and further structuring at least one lower layer of the layered stack, the further structuring using the hardmask layer, wherein the further structuring comprises forming a via hole.

* * * * *